United States Patent [19]

Toussaint

[11] Patent Number: 4,942,498
[45] Date of Patent: Jul. 17, 1990

[54] FIXATION DEVICE WITH ADJUSTABLE TILTING

[75] Inventor: Daniel Toussaint, Spa, Belgium

[73] Assignee: Belgian Electronic Research S. A., Belgium

[21] Appl. No.: 233,138

[22] Filed: Aug. 17, 1988

[30] Foreign Application Priority Data

Jun. 30, 1988 [BE] Belgium .................. 8800756

[51] Int. Cl.⁵ ............................................. H05K 7/20
[52] U.S. Cl. ............................................. 361/388; 211/94; 211/99; 211/170
[58] Field of Search ............... 211/94, 99, 170; 361/388, 389, 386, 391; 174/52.1, 52.2, 57, 58

[56] References Cited

U.S. PATENT DOCUMENTS

| 4,323,836 | 4/1982 | Rice | 174/52.1 |
| 4,403,708 | 9/1983 | Smolik | 174/58 |
| 4,457,436 | 7/1984 | Kelley | 211/94 |

FOREIGN PATENT DOCUMENTS 3344576 12/1983 Fed. Rep. of Germany .

Primary Examiner—Roy N. Envall, Jr.
Attorney, Agent, or Firm—Kramer, Brufsky & Cifelli

[57] ABSTRACT

A device comprising an element (1) serving as a housing and a mounting frame for an apparatus and a suspending element (2), the latter comprising a means (5) suitable for working in conjunction with a complementary means (3) which is integral with the housing (1) so as to form a pivoting coupling; the device also includes adjustable means of spacing (4,5,6) integral with either one of elements (1,2) of the device, said spacing means being designed to work together with a surface of the other element in order to hold the housing (1) in an adjustable predetermined angular position. The spacing means comprise, for example, a means (5) integral with one of elements (1,2) and formed with a rib (4) designed to work together with any one of several grooves (7) formed in the other element.

33 Claims, 4 Drawing Sheets

FIXATION DEVICE WITH ADJUSTABLE TILTING

The present invention concerns a mechanical device for mounting an apparatus with an adjustable tilt in relation to the plane of the support surface. A device of this type is designed, for example, for apparatus for monitoring, access control, transmitters/receivers, or detection devices.

Monitors and other devices are usually placed in a housing, and in order to attach this housing with an adjustable tilt, the housing is generally mounted on a swivel-type mechanism which is attached to the support surface (a wall or a door, for example). With this type of mounting, the tilted position of the housing must be locked by means of a locking device, such as a screw, and the latter must be tightened after adjusting the tilt of the housing in the desired position. This type of device has the disadvantage of requiring a multiplicity of mechanical parts (housing, attachment part and locking device), and it is often subject to an external loss of adjustment, and is thus vulnerable to malicious acts and vandalism.

It is certainly possible to consider mounting the components of the apparatus on a mounting plate that can be fastened in the housing in several different tilting positions, and the housing can then be rigidly attached to the support surface. However, this mode of embodiment has the disadvantage of permitting adjustment of the tilt only before the circuits are mounted and connected in the housing, and of requiring the latter to be opened with at least partial disassembly of the internal circuits in order to be able to change the tilt later on.

The object of the invention is a mechanical mounting device that permits easy adjustment of the angle of tilt of an apparatus without having the disadvantages of known types of mounting.

Another object of the invention is a mechanical device which ensures optimization of the arrangement of the components constituting an apparatus, while combining two characteristics which are presumably difficult to reconcile: ruggedness and aesthetic design.

These objectives are attained, pursuant to the invention, by means of a device comprising a suspension element and an element that serves as a housing and mounting frame for an apparatus, the suspension element including a component suitable for working in cooperation with a complementary component that is integral with the housing so as to form a pivoting coupling, and the device also comprises adjustable means of spacing integral with either one of the elements of the device, said spacing means being designed to work together with one surface of the other of said elements in order to hold the housing in an adjustable predetermined angular position.

The spacing means include, for example, a spacing means integral with one of said elements, this means being formed with a rib designed to receive and work with any one of several grooves formed in the other elements. Different methods of execution are, of course, possible. The device can be supplemented by a means for preventing any longitudinal sliding of one element with respect to the other.

Other details of the invention are defined in the attached claims.

DESCRIPTION OF EXEMPLARY MODES OF EMBODIMENT

Figure 1:
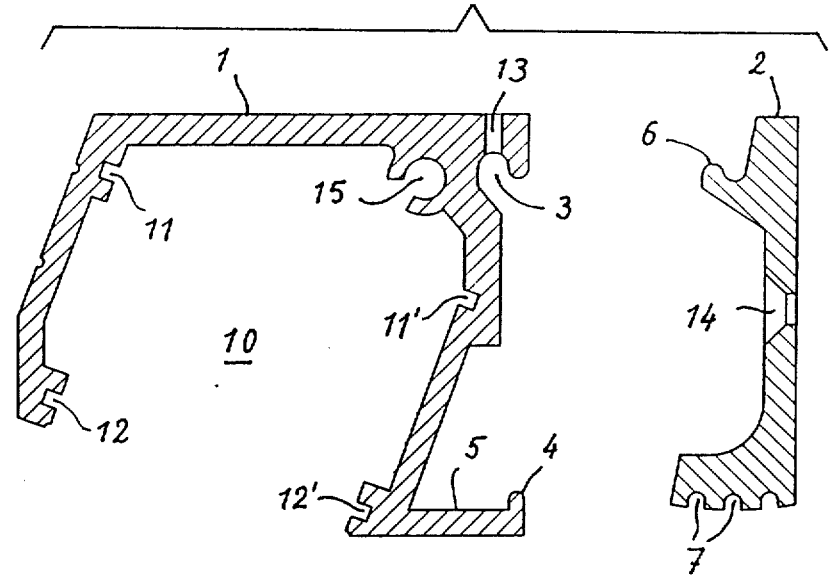
FIG. 1 is a cross-sectional view of the elements constituting a first method of embodiment exemplifying the device pursuant to the invention.
Figure 2:
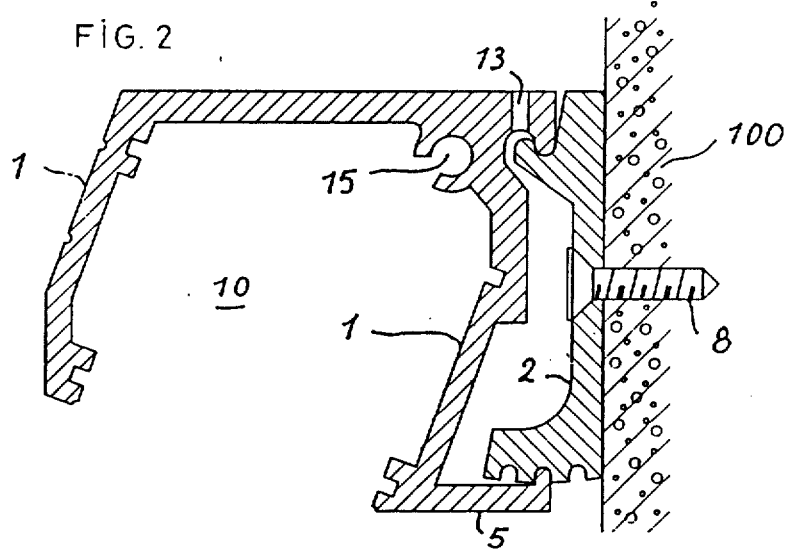
FIG. 2 shows the elements represented in FIG. 1 after assembly pursuant to the invention.

By referring to FIGS. 1 and 2, we see represented in a first mode of embodiment of the invention, a fixation device comprising an element 1 serving as a housing for any apparatus (for example, a detection device) and a frame for mounting components of that apparatus, and a suspension element 2 designed to be attached to any support structure (for example, a door, a wall, etc.). Elements 1 and 2 are designed, as will be described below in further detail, such that element 1 can be suspended and attached rigidly to suspension element 2 with an adjustable tilt with respect to the plane of the support structure. FIG. 2 shows element 1 made integral with suspension element 2.

In the example illustrated, elements 1 and 2 are advantageously constituted of two oblong parts made, for example, of extruded aluminum or injected plastic or any other material that can be shaped according to the desired profile. Elements 1 and 2 can obviously be made up of more than one part. Oblong part 1 is contoured to form a longitudinal channel 10 to serve as a housing for any device whatsoever. The shaped section is formed with at least one pair of grooves in the sides of channel 10. In the mode of execution in FIGS. 1 and 2, shaped section 1 has two pairs of grooves 11-11' and 12-12' to receive the opposite edges of printed circuit boards or inserts or any other mechanical part. Pair of grooves 12-12' can be used to hold a cover plate which can be transparent for possible radiation or visible light. The number of pairs of grooves, their shape and arrangement can obviously be adapted as needed. The role of the longitudinal cavity 15 will be explained below. Part 1 also has fixation means, consisting here of a groove 3 and a rib 4 placed at the end of a spacing means 5. In the example illustrated, means 3-5 are formed with the shaped section 1 itself, but it goes without saying that they could be constructed in another manner and added to a housing.

Fixation means 3 and 4 of element 1 are designed to work together with complementary means provided on suspension element 2, namely: a rib 6 designed to work with groove 3 and several grooves 7 designed to work with rib 4. In the example illustrated, the coupling means 6 and 7 are formed with section 2, but it is clear that they could be executed in another manner. Sometimes, grooves 7 are arranged on a curved surface of element 2. Ribs 4 and 6 are fit into the corresponding grooves 3 and 7, respectively, simply by sliding part 1 longitudinally along part 2. FIG. 2 shows parts 1 and 2 assembled, with rib 6 being housed in groove 3 and rib 4 being housed in middle groove 7. Groove 3 and rib 5 are formed so as to permit positioning of part 1 at different angles of tilt, rib 6 playing the role of a pivot around which part 1 articulates by means of groove 3. In this manner, by sliding rib 4 into one or another of grooves 7, while simultaneously sliding rib 6 into groove 3, element 1 is suspended from element 2 at a desired angle of tilt with respect to part 2, the angle of tilt being determined by the groove 7 selected to house rib 4. There can be any number of grooves 7, and thus, the number of grooves determines the possible number of angles of tilt.

Figure 3:
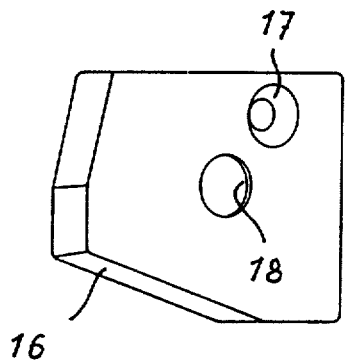
FIG. 3 represents an example of a lateral cover plate for the device in FIG. 2.

Assembly of the device is simple and rapid. Suspension element 2 is first attached to a support structure. For this reason, element 2 is formed with holes 14 for the passage of screws, such as 8, which are used to attach element 2 to support structure 100 (FIG. 2). Element 1 is then positioned with the desired angle of tilt by fitting one end of groove 3 over one end of rib 6 and simultaneously introducing the end of rib 4 into one of grooves 7, then simply sliding element 1 along suspension element 2. It is of interest to note that this mounting can be carried out with the device completely housed in element 1. This positioning ensures immobilization of element 1 in relation to element 2 in a vertical plane. Locking to prevent any longitudinal slipping of element 1 in relation to element 2 can be ensured by means of one or more screws set in holes such as 13, for example. Locking to prevent any lateral sliding can also be ensured by means of lateral cover plates, such as plate 16 shown in FIG. 3, for example. This plate is placed at each end of the device so as to interlock sections 1 and 2. These plates can be attached by means of screws inserted into one or more holes 17 and set in a threaded section of cavity 15 of section 1 (see FIG. 2). Cover plates 16 also have one or more grommets 18 to permit passage of the connecting wires of the electrical device housed in channel 10.

Figure 4:
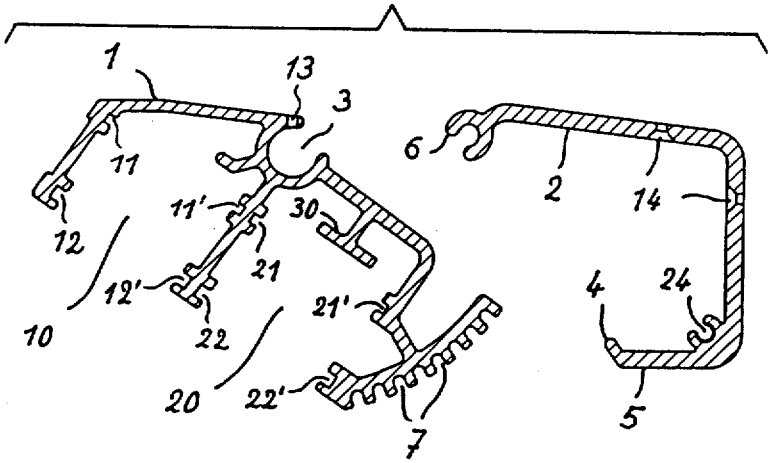
FIG. 4 is a cross-sectional view of the elements that constitute a second mode of embodiment exemplifying the device pursuant to the invention.
Figure 5:
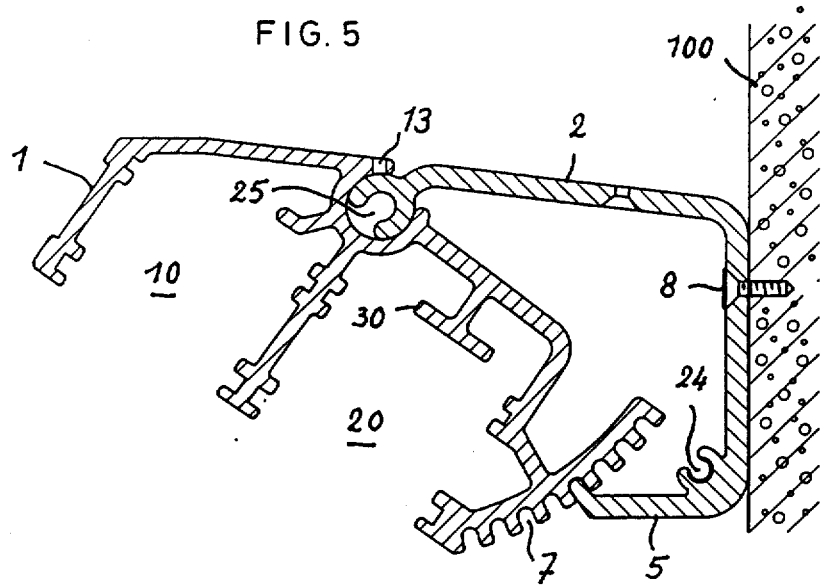
FIG. 5 shows the elements represented in FIG. 4 after assembly pursuant to the invention.

FIGS. 4 and 5 illustrate another mode of embodiment of the device pursuant to the invention. In these figures, the same reference notations as those in FIGS. 1 and 2 designate similar elements. In the example in FIGS. 4 and 5, it can be observed that parts 1 and 2 have somewhat different profiles than in FIGS. 1 and 2. Part 1 is shaped to form two longitudinal channels 10 and 20 which are designed to house the equipment for any device; grooves 11-11' and 12-12', 21-21' and 22-22' serve to hold printed circuit boards or inserts or any other mechanical part. It is clear that the number of channels formed and the number of pairs of grooves on the sides of the channels can be different from those shown in FIG. 4. Suspension part 2 has any number of holes, such as 14, for the passage of screws designed to attach part 2 to any structure, such as 100.

Another aspect that distinguishes the mode of embodiment in FIGS. 4 and 5 from the preceding example concerns the means of coupling or assembly of parts 1 and 2 to one another. Part 1 has a groove 3 and several grooves 7 placed on a curved surface; part 2 has a rib 6 designed to fit into and work with groove 3 and a rib 4 formed at the end of a spacing means 5 and designed to fit into and work with any one of grooves 7. The latter are formed in a curved surface of part 1. As in the example described previously, the assembly ribs are set into the corresponding grooves by longitudinally sliding part 1 along part 2.

Groove 3 of part 1 and rib 6 of part 2 are formed so as to permit positioning of part 1 according to several tilt angles with respect to the plane of support of part 2, depending on the choice of groove 7 into which rib 4 of part 2 is slipped.

Figure 6:
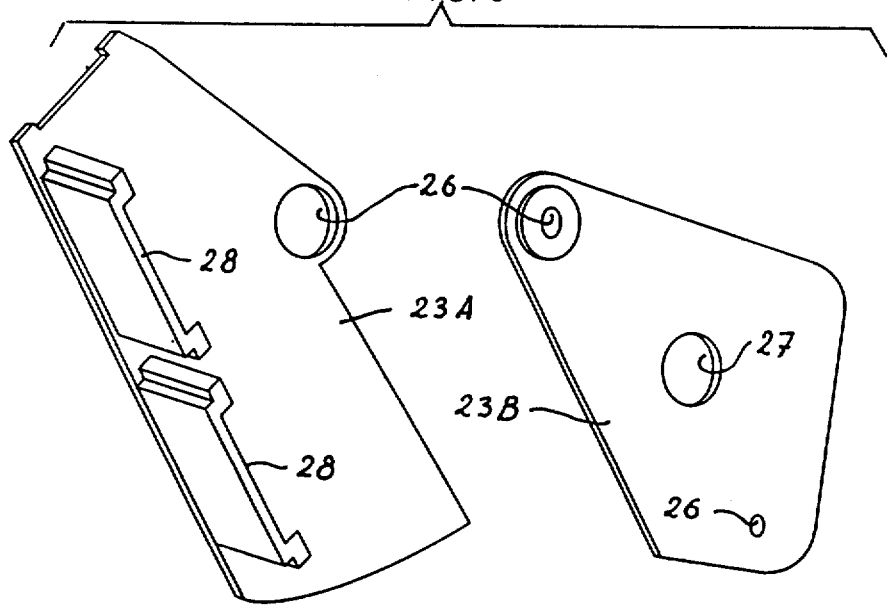
FIG. 6 represents an example of lateral cover plates for the device in FIG. 5.

When the assembly ribs have been slipped into the corresponding grooves, part 1 is suspended and immobilized in a vertical plane. Locking, to prevent any longitudinal slipping of element 1 with respect to element 2, can be provided by means of screws set into holes such as 13, for example. Longitudinal locking can also be provided by means of lateral cover plates. FIG. 6 represents an example of execution of lateral cover plates. Two plates 23A and 23B are placed at each end of the device against sections 1 and 2, these plates being attached by means of screws passing into holes 26 and being housed in the threaded parts of cavity 25 of section 1 and of cavity 24 of section 2 (see FIG. 5). One of plates 23A and 23B or both can also have any means whatsoever to permit the passage of connecting wires for the device housed in channels 10 and 20. This means can be any opening such as 27, or any other means providing a passage between between a lateral plate and one of sections 1 and 2. In the example shown in FIG. 6, plate 23A also has two tongues 28 which can advantageously be inserted into grooves 12-12' and 22-22' of element 1 in order to complete the attachment of the assembly.

Figure 7:
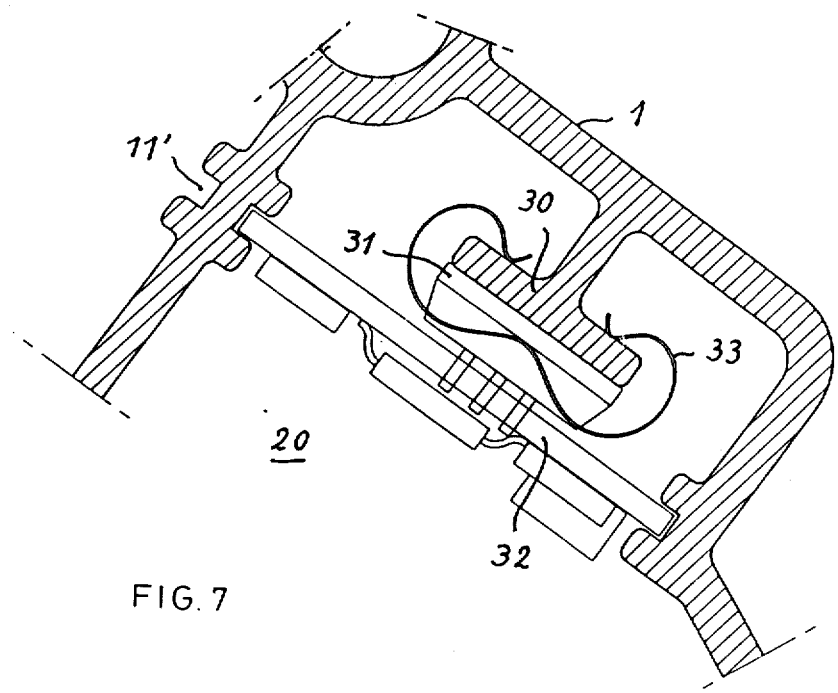
FIG. 7 is an enlarged view of a detail of FIG. 4 illustrating a novel aspect of the device pursuant to the invention.

An additional advantageous aspect of the device pursuant to the invention will be described now referring, more particularly to FIG. 7. The latter is an enlarged view of a detail of FIG. 4. Part 1, which serves as a housing, is advantageously shaped with a projecting rib 30, with which any electronic component that requires cooling can come into intimate contact. FIG. 7 shows, for example, a component 31 mounted on a printed circuit board 32 held in grooves 21-21' of section 1, the upper surface of this component 31 being in intimate contact with the surface of rib 30. This rib which is integral with the mass of the section serves as a heat bridge which ensures continuous cooling of component 31. The intimate contact between the component and the rib can be enhanced by a means of attachment, for example, by a clip, such as 33. A suitable intercalary material can obviously be placed between the surfaces of the clip and the rib that are in contact. It goes without saying that a rib such as 30 can be provided in more than one internal channel and that a rib can also be provided in a section that forms only one internal channel.

The methods of execution of elements 1 and 2 in the form of shaped sections as illustrated in FIGS. 1 and 4 attached have the considerable advantage of ensuring optimization in the manufacture of the mechanical parts and optimization of the arrangement of the components of an apparatus in an integrated structure which is both rugged and well designed.

Figure 8:
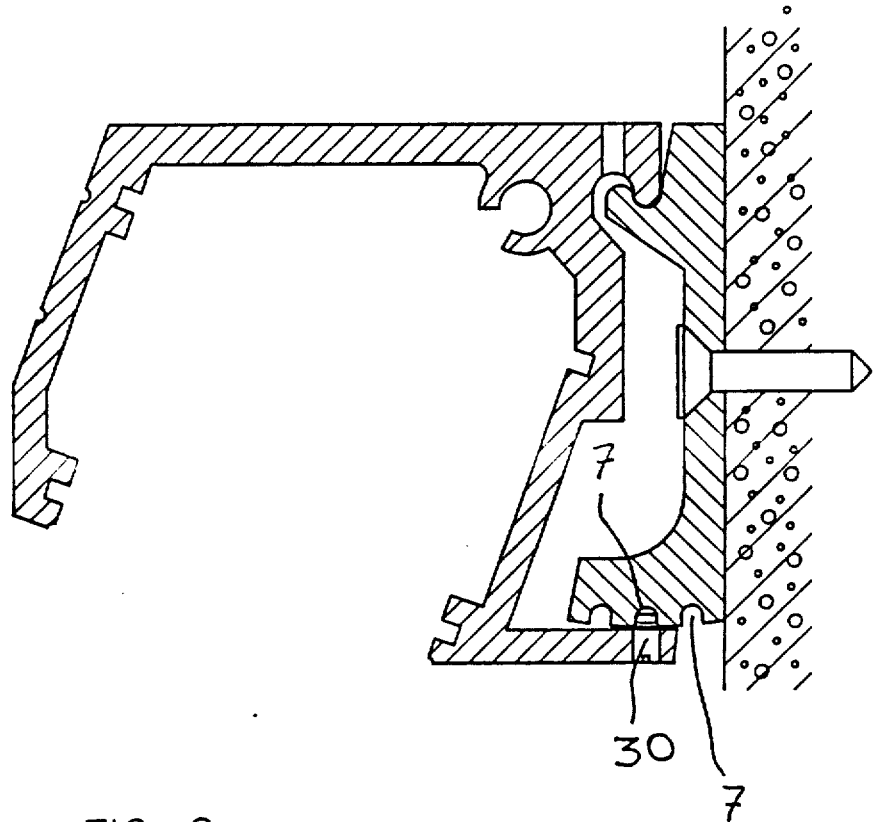
FIG. 8 shows the assembled elements represented in FIG. 1 incorporating a modification of the spacing means.
Figure 9:
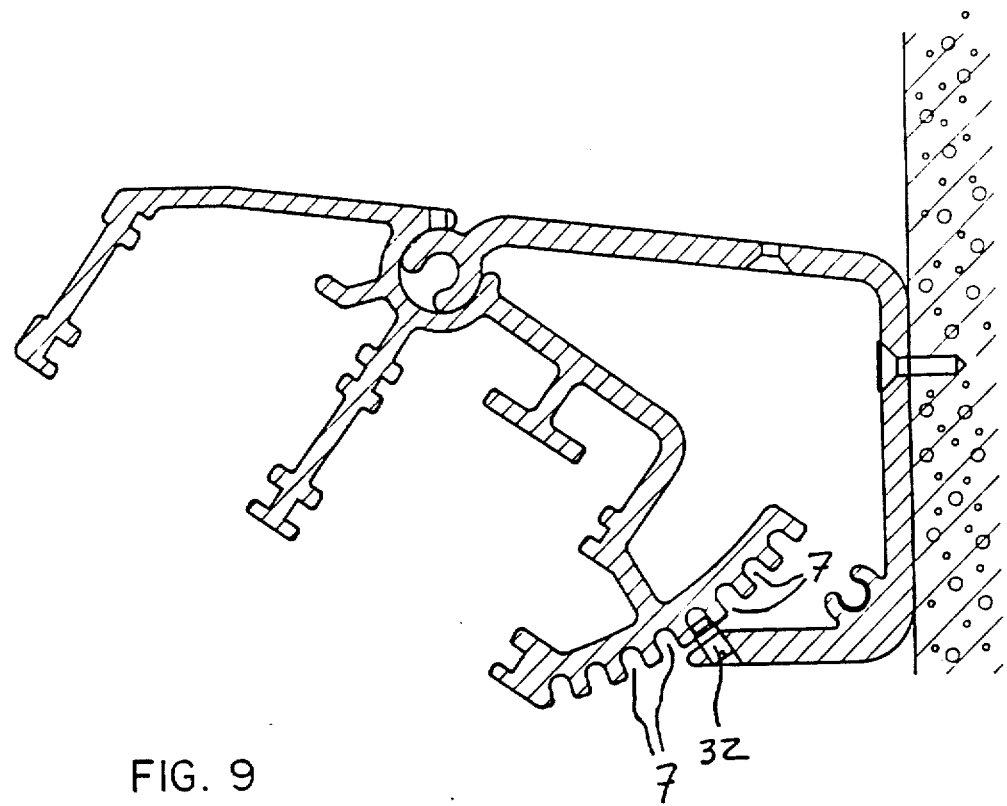
FIG. 9 shows the assembled elements represented in FIG. 4 incorporating a modification of the spacing means.

The methods of embodiment of the invention described in the preceding text are examples given by way of illustrative example, and the invention is in no way limited to these examples. Any modification, variation, or equivalent design must be considered as included within the scope of the invention. Thus, for example, spacing means 5 can be integral with one or the other of elements 1 and 2 and can be placed at any point on one or the other of these elements. Moreover, the spacing means and the means of adjusting the tilt could be effected in the form of any means (for example, a screw) working by friction with any surface of the other element. For example, FIG. 8 illustrates a modification of an element in FIG. 1 wherein the rib 4 of spacing means 15 is replaced with a screw 30 to engage one of the grooves 7. In FIG. 9, a modification of an element in FIG. 4 is illustrated wherein the screw 32 replaces the un-numbered rib comprising the end of spacing means 5.

I claim:

1. A device for mounting an apparatus, comprising:
a first element serving as a mounting frame for the apparatus;
a suspension element adapted for rigid attachment to a support surface;
means for rotatably connecting said first element to said suspension element; and
means for preselecting the angular position of said first element with respect to said suspension element, said preselecting means including means for holding said first element at a preselected angular position with respect to said suspension element.

2. Device according to claim 1, in which the means for holding comprises a spacing means integral with one of said first and suspension elements, said spacing means being formed with a rib designed to work together with any groove of a set of several grooves formed in the other of said first and suspension elements.

3. Device according to claim 2, in which the spacing means consists of a screw the end of which works together with one surface of the other of said first and suspension elements.

4. Device according to claim 1 or 2, comprising a means of preventing longitudinal sliding of the first element and the suspension element in relation to one another.

5. Device according to claim 3 comprising a means of preventing longitudinal sliding of the first element and the suspension element in relation to one another.

6. Device according to claim 4, characterized in that said means of preventing the longitudinal sliding consists of at least one screw.

7. Device according to claim 5, characterized in that said means of preventing the longitudinal sliding consists of at least one screw.

8. Device according to claim 4, characterized in that said means of preventing longitudinal slipping consists of at least one lateral cover plate attached to the end of said first element and said suspension element.

9. Device according to claim 5, characterized in that said means of preventing longitudinal slipping consists of at least one lateral cover plate attached to one end of said first element and said suspension element.

10. Device according to claims 1 or 2, in which said first element consists of a contoured element shaped so as to form at least one interior channel, the lateral walls of each channel having at least one pair of grooves to receive the edges of a circuit board, a component-holder board or any other mechanical part.

11. Device according to claim 3, in which said first element consists of a contoured element shaped so as to form at least one interior channel, the lateral walls of each channel having at least one pair of grooves to receive the edges of a circuit board, a component-holder board or any other mechanical part.

12. Device according to claim 4, in which said first element consists of a contoured element shaped so as to form at least one interior channel, the lateral walls of each channel having at least one pair of grooves to receive the edges of a circuit board, a component-holder board or any other mechanical part.

13. Device according to claim 5, in which said first element consists of a contoured element shaped so as to form at least one interior channel, the lateral walls of each channel having at least one pair of grooves to receive the edges of a circuit board, a component-holder board or any other mechanical part.

14. Device according to claim 6, in which said first element consists of a contoured element shaped so as to form at least one interior channel, the lateral walls of each channel having at least one pair of grooves to receive the edges of a circuit board, a component-holder board or any other mechanical part.

15. Device according to claim 7, in which said first element consists of a contoured element shaped so as to form at least one interior channel, the lateral walls of each channel having at least one pair of grooves to receive the edges of a circuit board, a component-holder board or any other mechanical part.

16. Device according to claim 8, in which said first element consists of a contoured element shaped so as to form at least one interior channel, the lateral walls of each channel having at least one pair of grooves to receive the edges of a circuit board, a component-holder board or any other mechanical part.

17. Device according to claim 9, in which said first element consists of a contoured element shaped so as to form at least one interior channel, the lateral walls of each channel having at least one pair of grooves to receive the edges of a circuit board, a component-holder board or any other mechanical part.

18. Device according to claim 10, characterized in that said contoured element is shaped with a means of assembly for attachment to the suspension element.

19. Device according to claim 11, characterized in that said contoured element is shaped with a means of assembly for attachment to the suspension element.

20. Device according to claim 12, characterized in that said contoured element is shaped with a means of assembly for attachment to the suspension element.

21. Device according to claim 13, characterized in that said contoured element is shaped with a means of assembly for attachment to the suspension element.

22. Device according to claim 14, characterized in that said contoured element is shaped with a means of assembly for attachment to the suspension element.

23. Device according to claim 15, characterized in that said contoured element is shaped with a means of assembly for attachment to the suspension element.

24. Device according to claim 16, characterized in that said contoured element is shaped with a means of assembly for attachment to the suspension element.

25. Device according to claim 17, characterized in that said contoured element is shaped with a means of assembly for attachment to the suspension element.

26. Device according to claim 10, characterized in that said contoured element has at least one interior rib projecting into the interior channel, the end of the interior rib being designed to come into intimate contact with a surface of a component in order to dissipate the heat from said component.

27. Device according to claim 11, characterized in that said contoured element has at least one interior rib projecting into the interior channel, the end of the interior rib being designed to come into intimate contact with a surface of a component in order to dissipate the heat from said component.

28. Device according to claim 12, characterized in that said contoured element has at least one interior rib projecting into an interior channel, the end of the interior rib being designed to come into intimate contact with a surface of a component in order to dissipate the heat from said component.

29. Device according to claim 13, characterized in that said contoured element has at least one interior rib projecting into an interior channel, the end of the interior rib being designed to come into intimate contact with a surface of a component in order to dissipate the heat from said component.

30. Device according to claim 14, characterized in that said contoured element has at least one interior rib projecting into an interior channel, the end of the interior rib being designed to come into intimate contact with a surface of a component in order to dissipate the heat from said component.

31. Device according to claim 15, characterized in that the said contoured element has at least one interior rib projecting into an interior channel, the end of the interior rib being designed to come into intimate contact with a surface of a component in order to dissipate the heat from said component.

32. Device according to claim 16, characterized in that said contoured element has at least one interior rib projecting into an interior channel, the end of the interior rib being designed to come into intimate contact with a surface of a component in order to dissipate the heat from said component.

33. Device according to claim 17, characterized in that said contoured element has at least one interior rib projecting into an interior channel, the end of the interior rib being designed to come into intimate contact with a surface of a component in order to dissipate the heat from said component.

* * * * *

UNITED STATES PATENT AND TRADEMARK OFFICE
CERTIFICATE OF CORRECTION

PATENT NO. : 4,942,498

DATED : July 17, 1990

INVENTOR(S) : Daniel Toussaint

It is certified that error appears in the above-identified patent and that said Letters Patent is hereby corrected as shown below:

Figures 8 and 9, as shown on the attached sheets, should be added to the drawings.

Signed and Sealed this

Fourteenth Day of January, 1992

Attest:

HARRY F. MANBECK, JR.

*Attesting Officer*      Commissioner of Patents and Trademarks